(12) United States Patent
Xu et al.

(10) Patent No.: US 8,427,835 B2
(45) Date of Patent: Apr. 23, 2013

(54) RACK SERVER

(75) Inventors: Ji-Peng Xu, Shanghai (CN); Tsai-Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 376 days.

(21) Appl. No.: 12/965,914

(22) Filed: Dec. 12, 2010

(65) Prior Publication Data

US 2012/0050981 A1      Mar. 1, 2012

(30) Foreign Application Priority Data

Aug. 25, 2010   (CN) .......................... 2010 1 0268952

(51) Int. Cl.
  *G06F 1/16*      (2006.01)
(52) U.S. Cl.
  USPC ........... 361/727; 361/679.33; 174/69; 211/26
(58) Field of Classification Search ............. 361/679.33, 361/724–727; 211/26; 174/69
  See application file for complete search history.

(56) References Cited

U.S. PATENT DOCUMENTS

| | | | | |
|---|---|---|---|---|
| 3,295,905 A * | 1/1967 | Sisk et al. | ...................... | 312/273 |
| 3,488,430 A * | 1/1970 | Holzhauser | ...................... | 174/69 |
| 3,710,199 A * | 1/1973 | Cignoni, Jr. | ................... | 361/827 |
| 4,660,125 A * | 4/1987 | Purdy et al. | .................... | 361/727 |
| 5,460,441 A * | 10/1995 | Hastings et al. | ............... | 312/298 |
| 5,571,256 A * | 11/1996 | Good et al. | ...................... | 211/26 |
| 5,746,389 A * | 5/1998 | Willmann | .................. | 242/615.1 |
| 5,801,921 A * | 9/1998 | Miller | ...................... | 361/679.32 |
| 5,890,602 A * | 4/1999 | Schmitt | .......................... | 211/13.1 |
| 6,070,742 A * | 6/2000 | McAnally et al. | ............... | 211/26 |
| 6,303,864 B1 * | 10/2001 | Johnson et al. | .................. | 174/69 |
| 6,305,556 B1 * | 10/2001 | Mayer | .............................. | 211/26 |
| 6,326,547 B1 * | 12/2001 | Saxby et al. | ..................... | 174/69 |
| 6,327,139 B1 * | 12/2001 | Champion et al. | ............. | 361/608 |
| 6,425,488 B1 * | 7/2002 | Notohardjono et al. | ........ | 211/26 |
| 6,435,354 B1 * | 8/2002 | Gray et al. | ....................... | 211/26 |
| 6,520,346 B1 * | 2/2003 | Liu | .................................... | 211/26 |
| 6,523,918 B1 * | 2/2003 | Baiza | .......................... | 312/265.1 |
| 6,685,033 B1 * | 2/2004 | Baddour et al. | ................. | 211/26 |
| 6,747,874 B2 * | 6/2004 | McKinnon et al. | ........... | 361/724 |
| 6,772,887 B2 * | 8/2004 | Audibert et al. | ................ | 211/26 |
| 6,805,248 B2 * | 10/2004 | Champion et al. | .............. | 211/26 |
| 6,854,605 B2 * | 2/2005 | Wrycraft | ......................... | 211/26 |
| 6,867,980 B2 * | 3/2005 | Wrycraft | ....................... | 361/727 |
| 6,902,069 B2 * | 6/2005 | Hartman et al. | ................. | 211/26 |
| 6,945,504 B2 * | 9/2005 | Chen et al. | .................. | 248/282.1 |
| 7,009,112 B1 * | 3/2006 | Mead et al. | ..................... | 174/69 |
| 7,023,708 B2 * | 4/2006 | Nguyen et al. | ................ | 361/810 |
| 7,026,551 B2 * | 4/2006 | Franz et al. | ..................... | 174/69 |

(Continued)

*Primary Examiner* — Lisa Lea Edmonds
(74) *Attorney, Agent, or Firm* — CKC & Partners Co., Ltd.

(57) ABSTRACT

A rack server includes a chassis having a front and a rear ends which are divided by a partition board into a first and a second chambers; a mother board module, located in the first chamber; a hard drive module, disposed in the second chamber. The hard drive module includes a hard drive cage, slidably disposed in the second chamber from the front end, in which the hard drive cage has a first and a second sides parallel to the partition board and the second side has a hard drive port; a hard drive backplane, vertically fixed to the first side of the hard drive cage; a plurality of hard drives, pluggably disposed in the hard drive cage and electrically connected to the hard drive backplane. An extendable/retractable support arm and a wire set arranged inside it maintain an electrical connection of the hard drive cage.

9 Claims, 3 Drawing Sheets

U.S. PATENT DOCUMENTS

| | | |
|---|---|---|
| 7,121,412 B2 * | 10/2006 | Richards et al. ................. 211/26 |
| 7,168,576 B2 * | 1/2007 | Williams ......................... 211/26 |
| 7,189,924 B1 * | 3/2007 | Popescu et al. ................. 174/69 |
| 7,201,279 B1 * | 4/2007 | Mimlitch et al. ................ 211/26 |
| 7,359,218 B2 * | 4/2008 | McGrew ........................ 361/826 |
| 7,451,957 B2 * | 11/2008 | Nguyen ...................... 248/282.1 |
| 7,472,795 B2 * | 1/2009 | Dubon et al. .................... 211/26 |
| 7,473,846 B2 * | 1/2009 | Doerr et al. ..................... 174/69 |
| 7,480,154 B2 * | 1/2009 | Lawrence et al. ............. 361/826 |
| 7,654,398 B2 * | 2/2010 | Bridges et al. .................. 211/26 |
| 7,806,277 B2 * | 10/2010 | Mimlitch et al. ................ 211/26 |
| 7,921,228 B2 * | 4/2011 | Lu ..................................... 710/2 |
| 8,014,144 B2 * | 9/2011 | Cheng et al. ............. 361/679.33 |
| 2005/0067358 A1 * | 3/2005 | Lee et al. ......................... 211/26 |
| 2011/0180297 A1 * | 7/2011 | Yu et al. .......................... 174/69 |
| 2011/0253647 A1 * | 10/2011 | Yu et al. .......................... 211/26 |

* cited by examiner

RACK SERVER

RELATED APPLICATIONS

This application claims priority to China Application Serial Number 201010268952.3, filed Aug. 25, 2010, which is herein incorporated by reference.

BACKGROUND

1. Field of Invention

The present invention relates to a server. More particularly, the present invention relates to a rack server.

2. Description of Related Art

A server is a core computer for serving computers in a network system. The server can provide a variety of functions for network users, such as storage and printing, and can also be used for sharing resources among the clients in the network system. A basic architecture of the server is similar to that of an ordinary personal computer. The server includes a central processing unit (CPU), a memory, a hard drive, and input and output devices, which are connected by a bus inside. A north bridge chip connects the CPU and the memory. A south bridge chip connects the input and the output devices.

A currently widely used rack server is a server with an appearance designed according to a unified international cabinet standard. The server is used with a cabinet. This manner has the following distinctive advantages. On one hand, the space occupied by the equipment is minimized, and on the other hand, the connection with other network devices and management becomes convenient, and also the room looks tidy and fine. A width of the rack server is 19 in and according to the height in the unit of U (1U=1.75 inch=44.45 mm), the rack server is generally classified into 1U, 2U, 3U, 4U, 5U, and 7U. The size of the cabinet also adopts the general industrial standards, generally from 22U to 42U. A removable sliding trailer is provided in the cabinet, depending on the height of U. The users may flexibly adjust the height based on the height of their servers for accommodating the network devices including a server, a hub, and a disk array enclosure. After the server is well placed, all to input and output wires are lead out from the rear of the cabinet and arranged in a wire slot of the cabinet.

FIG. 1 is a system architecture view of a conventional server. Referring to FIG. 1, the existing server 100 includes a mother board 110, a hard drive cage 120, a plurality of fans 130, and a plurality of connectors 140, in which a plurality of hard drives (not shown) are placed in the hard drive cage 120, and the connectors 140 are arranged on the mother board 110. The connectors 140 may be a power control connector, SATA connector, IDE connector, floppy disk connector, universal serial bus (USB) connector, and the like. The fans 130 are located between the mother board 110 and the hard drive cage 120, so as to dissipate the heat of the server 100.

SUMMARY

The present invention provides a rack server. The rack server includes:

a chassis, having a baseplate, a front end, and a rear end;

a partition board, disposed in the chassis and perpendicular to the baseplate and also perpendicular to the front end and the rear end to divide the chassis into a first chamber and a second chamber, in which the partition board has a routing port;

a mother board module, disposed in the first chamber;

a hard drive module, disposed in the second chamber, including:

a hard drive cage, adapted to be slidably disposed in the second chamber from the front end, in which the hard drive cage has a first side and a second side parallel to the partition board, and the second side has a hard drive port;

a hard drive backplane, vertically fixed to the first side of the hard drive cage; and a plurality of hard drives, pluggably disposed in the hard drive cage and electrically connected to the hard drive backplane, in which when the hard drive cage is extended out of the chassis, the hard drives are mounted in or withdrawn from the hard drive cage via the hard drive port;

an extendable/retractable support arm, horizontally disposed above the hard drive cage, with both ends pivoted to the partition board and the hard drive cage, respectively; and a wire set, arranged inside the support arm, in which as the support arm is extended/retracted, one end of the wire set is electrically connected to the hard drive backplane and the other end is electrically connected to the mother board module through the routing port.

According to an embodiment of the present invention, the mother board module includes a tray, slidably disposed in the first chamber from the front end; a mother board, having a plurality of input and output interfaces, fixedly disposed in the tray; and a control module, fixedly disposed on the baseplate of the chassis.

According to another embodiment of the present invention, the control module has a power/fan control backplane and an adapter plate, in which the adapter plate is electrically connected to the mother board by gold fingers, the power/fan control backplane supplies power to the hard drive backplane through the wire set, and the adapter plate performs signal transmission to the hard drive backplane through the wire set.

According to yet another embodiment of the present invention, the server further comprises a fan module located at the rear end, in which the fan module and the mother board are respectively deposed at two sides of the control module, and the fan module blows air to the rear end of the chassis and is electrically connected to the control module.

The server further comprises an input and output interface panel vertically disposed on the tray, wherein the input and output interfaces are respectively exposed out of the input and output interface panel, and the input and output interface panel is located at the front end of the chassis when the tray is located inside the chassis.

The server further comprises a power panel, electrically connected to the control module and having a DC power interface, in which the power panel is located at the front end of the chassis, and is adjacent to and on the same plane of the input and output interface panel.

According to an embodiment of the present invention, the first side of the hard drive cage is close to the partition board and the second side is away from the partition board.

According to an embodiment of the present invention, the hard drive module is on the same plane of the mother board module.

According to an embodiment of the present invention, the support art is formed by a plurality of connecting rods pivoted together.

In the foregoing, the positions of components in the server of the present invention have been rearranged to meet the customization requirements.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
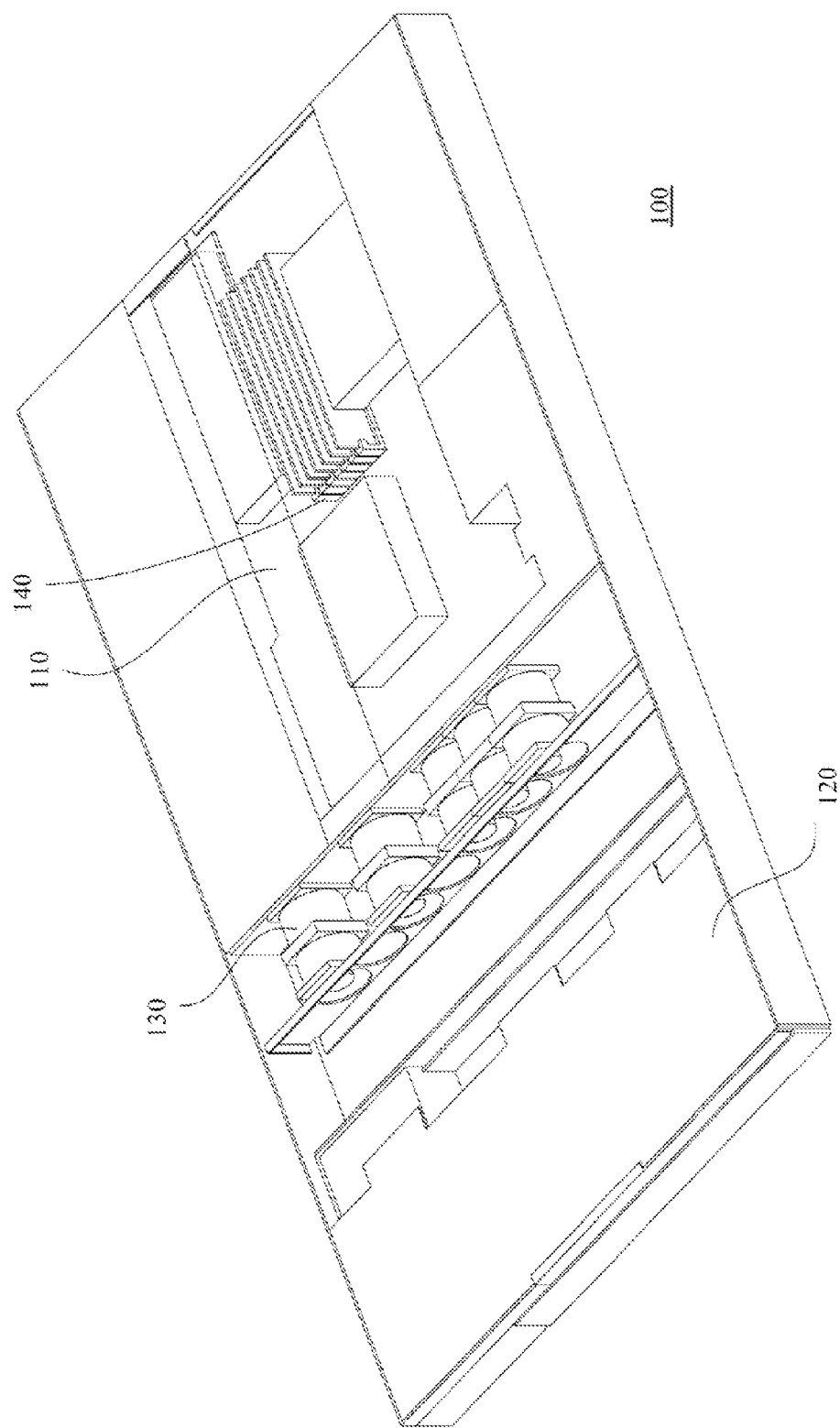
FIG. 1 is a schematic structural view of a conventional rack server.

Reference will now be made in detail to the present embodiments of the invention, examples of which are illustrated in the accompanying drawings. Wherever possible, the same reference numbers are used in the drawings and the description to refer to the same or like parts.

Figure 2:
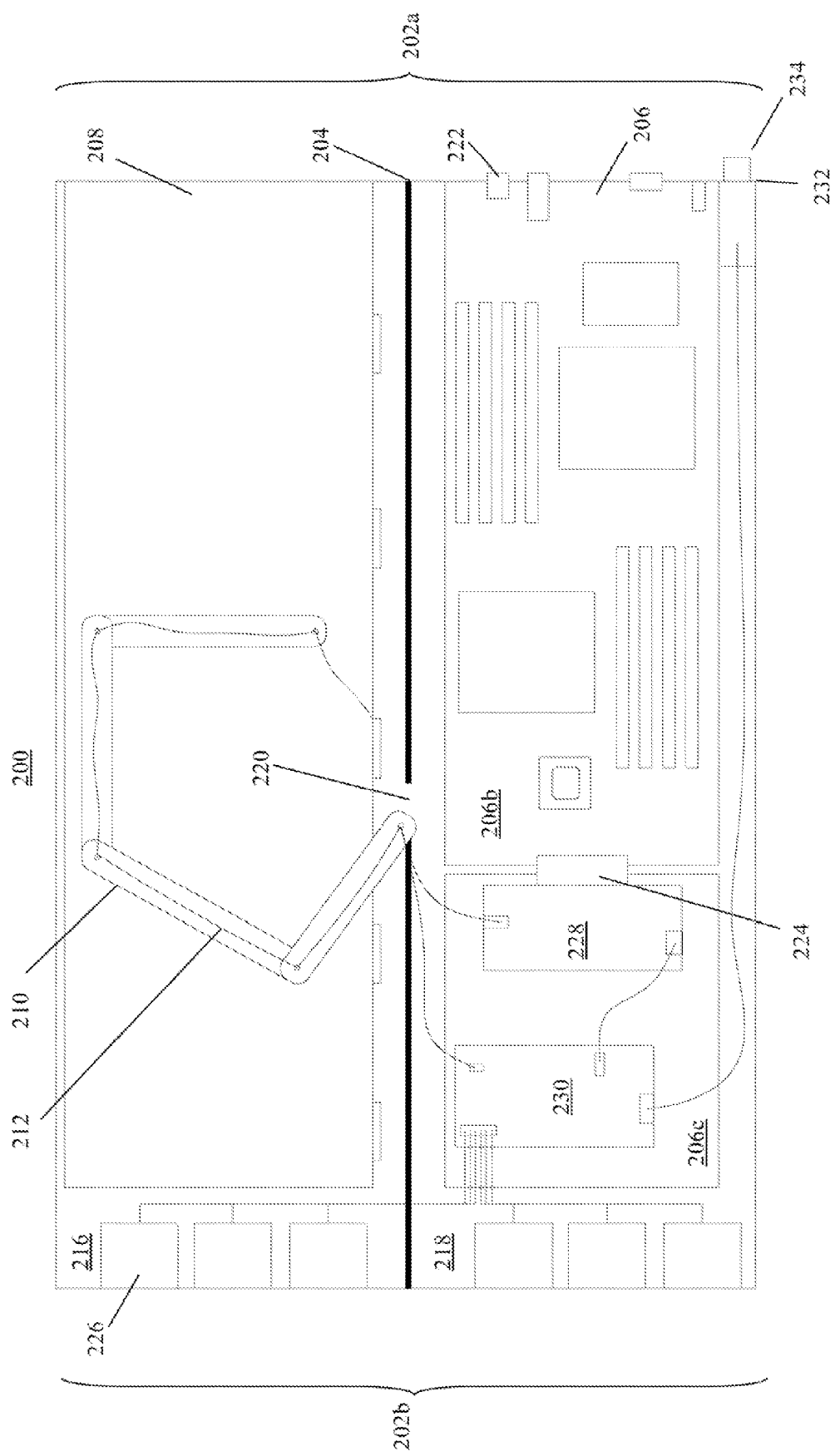
FIG. 2 is a schematic view of a rack server according to an embodiment of this invention.
Figure 3:
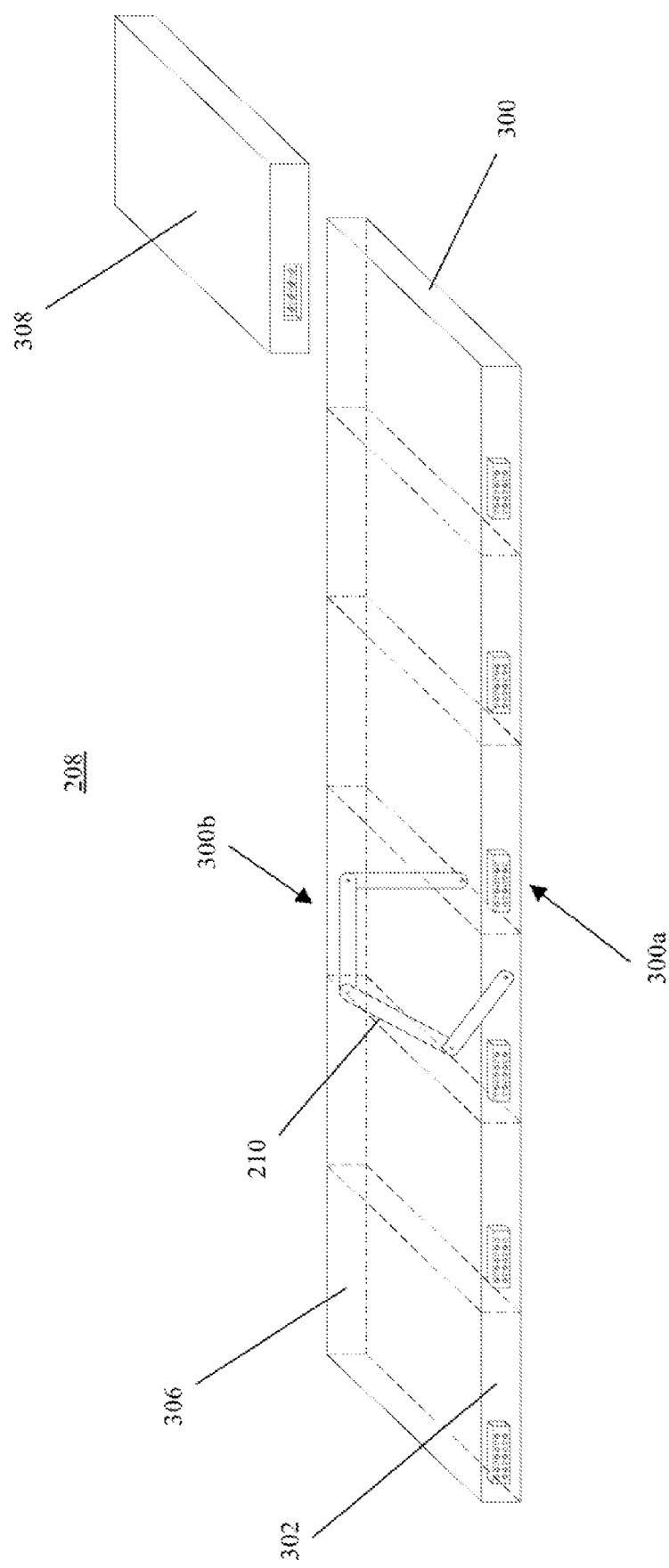
FIG. 3 is a schematic view of a hard drive module of the rack server according to an embodiment of this invention.

FIG. 2 is a schematic view of a rack server according to an embodiment of this invention, and FIG. 3 is a schematic view of a hard drive module of the rack server according to an embodiment of this invention. Referring to FIG. 2 and FIG. 3, a 1U rack server 200 comprises a chassis 202, a partition board 204, a mother board module 206, a hard drive module 208, an extendable/retractable support arm 210, and a wire set 212 arranged inside the support arm 210. The chassis 202 has a baseplate 214, a front end 202a, and a rear end 202b. The partition board 204 is disposed in the chassis 202 and is perpendicular to the baseplate 214 and also perpendicular to the front end 202a and the rear end 202b to divide the chassis 202 into a first chamber 216 and a second chamber 218, in which the partition board 204 has a routing port 220. The mother board module 206 is disposed in the first chamber 216, and the hard drive module 208 is disposed in the second chamber 218. The hard drive module 208 includes a hard drive cage 300, adapted to be slidably disposed in the second chamber 218 from the front end 202a. The hard drive cage 300 has a first side 300a and a second side 300b parallel to the partition board 204, and the second side 300b has a hard drive port 306; a hard drive backplane 302, vertically fixed to the first side 300a of the hard drive cage 300; a plurality of hard drives 308, pluggably disposed in the hard drive cage 300 and electrically connected to the hard drive backplane 302, in which when the hard drive cage 300 is extended out of the chassis 202, the hard drives 308 are mounted in or withdrawn from the hard drive cage 300 via the hard drive port 306. The extendable/retractable support arm 210 is horizontally disposed above the hard drive cage 300, with both ends pivoted to the partition board 204 and the hard drive cage 300, respectively. The wire set 212 is arranged inside the support arm 210, and as the support arm 210 is extended/retracted, one end of the wire set 212 is electrically connected to the hard drive backplane 302 and the other end is electrically connected to the mother board module 206 through the routing port 220.

The chassis 202 includes the baseplate 214, and the front end 202a and the rear end 202b. The partition board 204 is a thin strip plate with the same length of the chassis 202, which is disposed in the chassis 202 and is perpendicular to the baseplate 214 and also perpendicular to the front end 202a and the rear end 202b. In simplicity, the partition board 204 divides the chassis 202 into the first chamber 216 and the second chamber 218 abutting the first chamber 216. In addition, the partition board 204 has a routing port 220 for the wire set 212 to penetrate.

The mother board module 206 is disposed in the first chamber 216, and the hard drive module 208 is disposed in the second chamber 218. In this embodiment, the hard drive module 208 is on the same plane of the mother board module 206. The support arm 210 is formed by a plurality of connecting rods pivoted together, and can be retracted or extended freely at the pivot points. The support arm 210 is horizontally disposed above the hard drive module 208, with both ends pivoted to the partition board 204 and the hard drive module 208, respectively. One end of the support arm 210 is adjacent to the routing port 220 on the partition board 204. For the wire set 212 arranged inside the support arm 210, as the support arm 210 is extended or retracted, one end of the wire set 212 is electrically connected to the hard drive module 208 and the other end is electrically connected to the mother board module 206 through the routing port 220.

The hard drive module 208 comprises the hard drive cage 300, the hard drive backplane 302, and the plurality of hard drives 308. The hard drive cage 300 has the first side 300a and the second side 300b parallel to the partition board 204, and the first side 300a is close to the partition board 204, and the second side 300b is away from the partition board 204. The hard drive backplane 302 is vertically fixed to the first side 300a of the hard drive cage 300, and the second side 300b has a hard drive port 306. The hard drive backplane 302 has interfaces required for the hard drives 308 to plug thereon, so the hard drives 308 can be mounted in or withdrawn from the hard drive cage 300 via the is hard drive port 306 of the second side 300b. If the hard drives 308 need to be added or removed, then it is only required that the hard drive cage 300 is extended out of the second chamber 216 from the front end 202a of the server 200, to plug and unplug the hard drives 308 at the hard drive port 306 of the second side 300b. In order to realize the electrical connection of the hard drive backplane 302 and the mother board module 206 when the hard drive cage 300 is extended out of the chassis 202, the present invention provides the support arm 210 and the wire set 212 arranged inside the support arm 210. The support arm 210 is formed by a plurality of connecting rods pivoted together, and can be retracted or extended freely at the pivot points. In this embodiment, the wire set 212 arranged inside the support arm 210 has one end electrically connected to the hard drive backplane 302. In this manner, when the hard drive cage 300 is inside the chassis 202, the support arm 210 and the wire set 212 inside it are in a retracted state. When the hard drive cage 300 is extended out of the chassis 202, the support arm 210 and the wire set 212 inside it are in an extended state. In both states, the electrical connection with the hard drive backplane 302 can be maintained.

Further, in this embodiment, the mother board module 206 further includes a tray 206a (not shown), a mother board 206b, and a control module 206c. The mother board 206b is fixedly disposed in the tray 206a, with a plurality of input and output interfaces 222 thereon. When the tray 206a is slidably disposed in the first chamber 216 via the front end 202a of the server 200, the input and output interfaces 222 are located at the front end 202a of the server 200. The control module 206c is fixedly disposed on the baseplate 214. The control module 206c is comprised of an adapter plate 228 and a power/fan control backplane 230, in which the adapter plate 228 conducts signal transmission between the hard drive module 208 and the mother board 206b, and the power/fan control backplane 230 is used to control the power supply and the fan speed in the server 200. After the mother board 206b slides in the first chamber along with the tray 206a, the mother board 206b is electrically connected to the adapter plate 228 by gold fingers 224, and the power/fan control backplane 230 is electrically connected to the hard drive backplane 302 in the hard drive module 208 by the wire set 212 and supplies power to it.

Preferably, the server 200 further has an input and output interface panel, a power panel 232, and a fan module 226. The input and output interface panel is vertically disposed on the tray 206a of the mother board module 206. The input and output interfaces 222 of the mother board 202b are exposed outside the input and output interface panel, and when the tray 206a is located inside the chassis 202, the input and output interface panel is located at the front end 202a of the chassis 202. When maintenance of the server 200 is desired, all of the interfaces are located at the front end 202a of the server 200, and the maintenance operation only needs to be performed on the input and output interface panel.

Preferably, the power panel 232 is electrically connected to the power/fan control backplane 230 in the control module 206c, and also has a DC power interface 234, through which an external DC power can be electrically connected to the power/fan control backplane 230, so as to effectively make use of the space in the chassis. In this embodiment, the power panel 232 is located at the front end 202a of the chassis 202, and is adjacent to and on the same plane of the input and output interface panel.

Preferably, the fan module 226 is located at the rear end 202b of the server 200, and is electrically connected to the power/fan control backplane 230 in the mother board module 206, so as to blow air to the rear end 202b. Because the first chamber 216 and the second chamber 218 are two abutting spaces divided by the partition board 204, the fan module 226 performs ventilation and heat dissipation for the mother board module 206 in the first chamber 216 and the hard drive module 208 in the second chamber 218, respectively, thereby improving the cooling efficiency and reducing the energy consumption.

As described above, in the server of the present invention, the positions of the hard drive module and the mother board module have been rearranged, through the electrical connection of the extendable/retractable support arm and the wire set inside it to meet the customization requirements and meanwhile effectively make use of the space in the chassis.

In addition, the sliding arrangement of the mother board module and the hard drive module relative to the chassis is convenient for users to remove the hard drives, input/output interface panel, or mother board from the chassis for repair or replacement of the hard drives and electronic components disposed on the input/output interface panel or mother board.

Furthermore, the fan module is located at the rear end of the server for to cooling the hard drive module and the mother board module, respectively, so as to improve the cooling efficiency and reduce the energy consumption.

Although the present invention has been described in considerable detail with reference to certain embodiments thereof, other embodiments are possible. Various alternations and modifications can be made by those skilled in the art without departing the spirit and scope of the present invention as defined by appended claims.

What is claimed is:

1. A rack server, comprising:
   a chassis, having a baseplate, a front end, and a rear end;
   a partition board, disposed in the chassis and perpendicular to the baseplate and also perpendicular to the front end and the rear end to divide the chassis into a first chamber and a second chamber, the partition board having a routing port;
   a mother board module, disposed in the first chamber;
   a hard drive module, disposed in the second chamber, comprising:
   a hard drive cage, adapted to be slidably disposed in the second chamber from the front end, the hard drive cage having a first side and a second side parallel to the partition board, and the second side having a hard drive port;
   a hard drive backplane, vertically fixed to the first side of the hard drive cage; and
   a plurality of hard drives, pluggably disposed in the hard drive cage and electrically connected to the hard drive backplane, wherein when the hard drive cage is extended out of the chassis, the hard drives are mounted in or withdrawn from the hard drive cage via the hard drive port;
   an extendable/retractable support arm, horizontally disposed above the hard drive cage, with both ends pivoted to the partition board and the hard drive cage, respectively; and
   a wire set, arranged inside the support arm, wherein as the support arm is extended/retracted, one end of the wire set is electrically connected to the hard drive backplane and the other end is electrically connected to the mother board module through the routing port.

2. The rack server of claim 1, wherein the mother board module comprises:
   a tray, slidably disposed in the first chamber from the front end;
   a mother board, having a plurality of input and output interfaces, fixedly disposed in the tray, and
   a control module, fixedly disposed on the baseplate of the chassis.

3. The rack server of claim 2, wherein the control module has a power/fan control backplane and an adapter plate, the adapter plate is electrically connected to the mother board by gold fingers, the power/fan control backplane supplies power to the hard drive backplane through the wire set, and is the adapter plate performs signal transmission to the hard drive backplane through the wire set.

4. The rack server of claim 2, further comprising a fan module located at the rear end, in which the fan module and the mother board are separately deposed at two sides of the control module, blows air to the rear end of the chassis and is electrically connected to the control module.

5. The rack server of claim 2, further comprising an input and output interface panel vertically disposed on the tray, wherein the input and output interfaces are respectively exposed out of the input and output interface panel, and the input and output interface panel is located at the front end of the chassis when the tray is located inside the chassis.

6. The rack server of claim 5, further comprising a power panel, electrically connected to the control module and having a DC power interface, the power panel being located at the front end of the chassis and adjacent to and on the same plane of the input and output interface panel.

7. The rack server of claim 1, wherein the first side of the hard drive cage is close to the partition board and the second side is away from the partition board.

8. The rack server of claim 1, wherein the hard drive module is on the same plane of the mother board module.

9. The rack server of claim 1, wherein the support art is formed by a plurality of connecting rods pivoted together.

* * * * *